US010542617B2

(12) United States Patent
Jung et al.

(10) Patent No.: US 10,542,617 B2
(45) Date of Patent: Jan. 21, 2020

(54) ELECTRONIC DEVICE AND METHOD FOR MANUFACTURING THE SAME

(71) Applicant: Samsung Electronics Co., Ltd., Gyeonggi-do (KR)

(72) Inventors: Hwa-Joong Jung, Gyeonggi-do (KR); Man-Ho Kim, Gyeonggi-do (KR); Hyung-Jin Rho, Gyeonggi-do (KR); Dong-Youl Park, Gyeonggi-do (KR); Ki-Huk Lee, Gyeonggi-do (KR); Yong-Hwan Choi, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 80 days.

(21) Appl. No.: 15/426,705

(22) Filed: Feb. 7, 2017

(65) Prior Publication Data

US 2017/0245360 A1 Aug. 24, 2017

(30) Foreign Application Priority Data

Feb. 18, 2016 (KR) .......................... 10-2016-0019388

(51) Int. Cl.
*H05K 1/00* (2006.01)
*H05K 1/02* (2006.01)
(Continued)

(52) U.S. Cl.
CPC ......... *H05K 1/0215* (2013.01); *H04N 5/2253* (2013.01); *H05K 1/147* (2013.01);
(Continued)

(58) Field of Classification Search
CPC ...... H05K 1/0215; H05K 1/18; H05K 5/0217; H05K 5/04; H05K 13/00; H04M 1/0264;
(Continued)

(56) References Cited

U.S. PATENT DOCUMENTS 8,369,703 B2 * 2/2013 Kim ..................... H04N 5/2253
361/220
9,774,766 B2 * 9/2017 Park .................... H04M 1/0264
(Continued)

FOREIGN PATENT DOCUMENTS

EP 1 465 411 10/2004
JP 2006-303110 11/2006
(Continued)

OTHER PUBLICATIONS

International Search Report dated May 23, 2017 issued in counterpart application No. PCT/KR2017/001667, 9 pages.
(Continued)

*Primary Examiner* — Pete T Lee
(74) *Attorney, Agent, or Firm* — The Farrell Law Firm, P.C.

(57) ABSTRACT

An electronic device is provided. The electronic device includes a printed circuit board having a terminal formed thereon, an image sensor electrically connected to the terminal, and a metal casing enclosing a surface of the image sensor, wherein the metal casing comprises a first portion spaced apart from the printed circuit board by a first distance and a second portion spaced apart from the printed circuit board by a second distance.

17 Claims, 11 Drawing Sheets

(51) Int. Cl.
    *H05K 13/00*   (2006.01)
    *H04N 5/225*   (2006.01)
    *H05K 1/14*    (2006.01)
    *H05K 1/18*    (2006.01)
    *H05K 5/02*    (2006.01)
    *H05K 5/04*    (2006.01)

(52) U.S. Cl.
    CPC .............. *H05K 1/18* (2013.01); *H05K 5/0217* (2013.01); *H05K 5/04* (2013.01); *H05K 13/00* (2013.01); *H05K 2201/10151* (2013.01)

(58) Field of Classification Search
    CPC ............ H04M 2250/52; H04N 5/2257; H04K 2201/10151
    See application file for complete search history.

(56) References Cited

U.S. PATENT DOCUMENTS

| | | |
|---|---|---|
| 2005/0276027 A1 | 12/2005 | Shen et al. |
| 2006/0232898 A1 | 10/2006 | Morishita |
| 2008/0252774 A1 | 10/2008 | Chen et al. |
| 2012/0092845 A1* | 4/2012 | Lee ................. H05K 9/0079 361/807 |
| 2015/0077624 A1 | 3/2015 | Havskjold et al. |
| 2015/0366110 A1 | 12/2015 | Park et al. |

FOREIGN PATENT DOCUMENTS

| | | |
|---|---|---|
| JP | 2010-135489 | 6/2010 |
| JP | 2012-190825 | 10/2012 |
| KR | 1020090089493 | 8/2009 |
| KR | 1020100112810 | 10/2010 |
| KR | 10-1361446 | 2/2014 |
| KR | 10-2015-0142386 | 12/2015 |

OTHER PUBLICATIONS

European Search Report dated Jun. 27, 2017 issued in counterpart application No. 17156205.1-1902, 8 pages.

* cited by examiner

ELECTRONIC DEVICE AND METHOD FOR MANUFACTURING THE SAME

PRIORITY

This application claims priority under 35 U.S.C. § 119(a) to Korean Patent Application Serial No. 10-2016-0019388, which was filed in the Korean Intellectual Property Office on Feb. 18, 2016, the entire content of which is incorporated herein by reference.

BACKGROUND

1. Field of the Disclosure

The present disclosure relates generally to an electronic device, and more particularly, to an electronic device including a camera lens module having improved discharge performance.

2. Description of the Related Art

Portable terminals, such as smart phones, which have been widely used with the development of mobile communication technologies, have at least one compact and lightweight camera lens module.

High-capacity and high-performance camera lens modules are required for recent portable terminals, and a part of a camera lens module is typically made of metal in order to improve mechanical properties (for example, rigidity) of the camera lens module.

The camera lens modules are susceptible to an external electric shock (for example, static electricity) because the camera lens module has a relatively large thickness due to the nature of the slim portable terminal.

For example, electricity introduced into the portable terminal may be transmitted to the camera lens modules, which can cause noise or performance degradation in electronic components within the camera lens modules, thereby resulting in a malfunction or damage to the electronic device.

SUMMARY

An aspect of the present disclosure provides an electronic device including a camera lens module in a shape capable of reducing an external electric shock.

In accordance with an aspect of the present disclosure, there is provided an electronic device. The electronic device includes a printed circuit board having a terminal formed thereon, an image sensor electrically connected to the terminal, and a metal casing enclosing a surface of the image sensor, wherein the metal casing comprises a first portion spaced apart from the printed circuit board by a first distance and a second portion spaced apart from the printed circuit board by a second distance.

In accordance with an aspect of the present disclosure, there is provided an electronic device. The electronic device includes a printed circuit board having a terminal formed thereon, an image sensor electrically connected to the terminal, and a metal casing enclosing a surface of the image sensor, wherein a first portion is formed on one surface of the metal casing and is spaced apart from the printed circuit board by a first distance, and a second portion is disposed between the metal casing and the printed circuit board and is spaced apart from the printed circuit board by a second distance.

In accordance with an aspect of the present disclosure, there is provided a method for manufacturing an electronic device. The method includes manufacturing a plurality of portions having different electrical paths on one surface of a metal casing formed to surround at least a part of a flexible circuit board of the electronic device and disposing a printed circuit board below the metal casing having the plurality of portions, the printed circuit board being electrically connected with a terminal disposed on the flexible circuit board.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
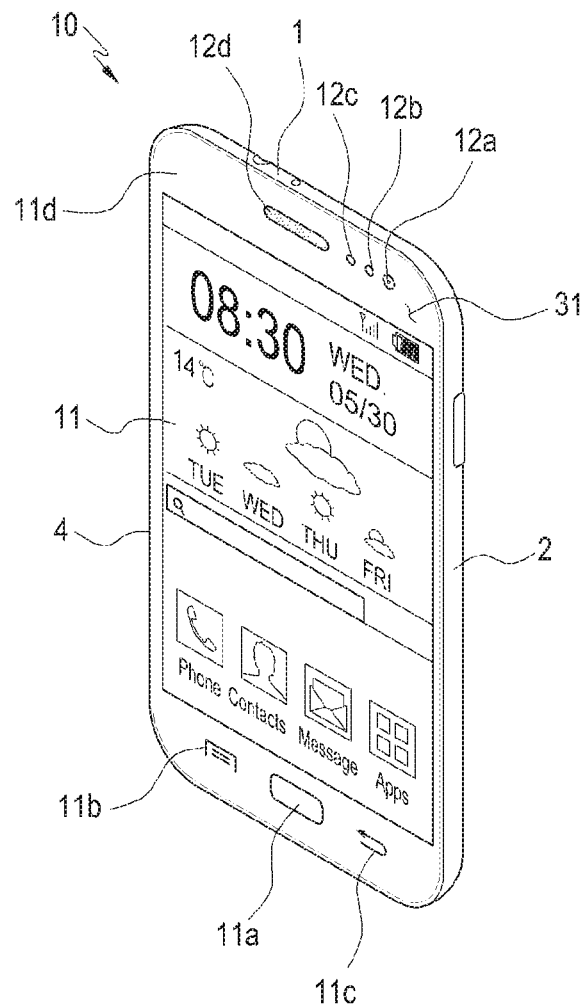
FIG. 1 is a front perspective view of an electronic device provided with a key module, according to an embodiment of the present disclosure.

Embodiments of the present disclosure will be described herein below with reference to the accompanying drawings. However, the embodiments of the present disclosure are not limited to the specific embodiments and should be construed as including all modifications, changes, equivalent devices and methods, and/or alternative embodiments of the present disclosure.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the present disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a CPU or an application processor) capable of performing a corresponding operation by executing one or more software programs stored in a memory device.

The term "module" as used herein may be defined as, for example, a unit including one of hardware, software, and firmware or two or more combinations thereof. The term "module" may be interchangeably used with, for example, the terms "unit", "logic", "logical block", "component", or "circuit", and the like. The "module" may be a minimum unit of an integrated component or a part thereof. The "module" may be a minimum unit performing one or more functions or a part thereof. The "module" may be mechanically or electronically implemented. For example, the "module" may include at least one of an application-specific integrated circuit (ASIC) chip, field-programmable gate arrays (FPGAs), or a programmable-logic device, which is well known or will be developed in the future, for performing certain operations.

The terms used in describing the various embodiments of the present disclosure are for the purpose of describing particular embodiments and are not intended to limit the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure.

Electronic devices according to the embodiments of the present disclosure may include at least one of, for example, smart phones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to an embodiment of the present disclosure, the wearable devices may include at least one of accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), or implantable wearable devices (e.g., implantable circuits).

The electronic devices may be smart home appliances. The smart home appliances may include at least one of, for example, televisions (TVs), digital versatile disk (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, or electronic picture frames.

The electronic devices may include at least one of various medical devices (e.g., various portable medical measurement devices (such as blood glucose meters, heart rate monitors, blood pressure monitors, or thermometers, and the like), a magnetic resonance angiography (MRA) device, a magnetic resonance imaging (MRI) device, a computed tomography (CT) device, scanners, or ultrasonic devices, and the like), navigation devices, global positioning system (GPS) receivers, event data recorders (EDRs), flight data recorders (FDRs), vehicle infotainment devices, electronic equipment for vessels (e.g., navigation systems, gyrocompasses, and the like), avionics, security devices, head units for vehicles, industrial or home robots, automatic teller machines (ATMs), points of sales (POSs) devices, or Internet of Things (IoT) devices (e.g., light bulbs, various sensors, electric or gas meters, sprinkler devices, fire alarms, thermostats, street lamps, toasters, exercise equipment, hot water tanks, heaters, boilers, and the like).

The electronic devices may further include at least one of parts of furniture or buildings/structures, electronic boards, electronic signature receiving devices, projectors, or various measuring instruments (such as water meters, electricity meters, gas meters, or wave meters, and the like). The electronic devices may be one or more combinations of the above-mentioned devices. The electronic devices may be flexible electronic devices. Also, the electronic devices are not limited to the above-mentioned devices, and may include new electronic devices according to the development of new technologies.

Hereinafter, the electronic devices according to various embodiments of the present disclosure will be described with reference to the accompanying drawings. The term "user" as used herein may refer to a person who uses an electronic device or may refer to a device (e.g., an artificial intelligence electronic device) which uses an electronic device.

Figure 2:
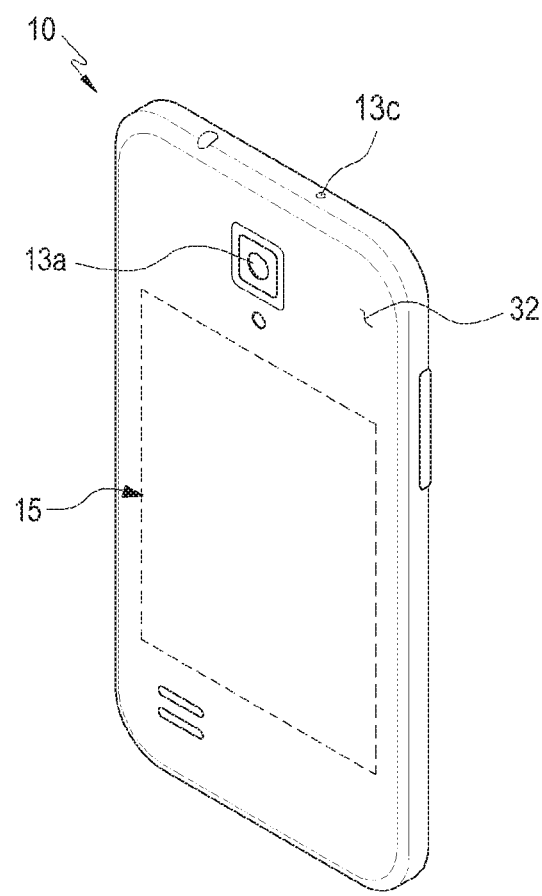
FIG. 2 is a rear perspective view of the electronic device provided with the key module, according to an embodiment of the present disclosure.

FIG. 1 is a front perspective view of an electronic device 10, and FIG. 2 is a rear perspective view of the electronic device 10. The electronic device 10 may be a smart phone or a wearable device. Hereinafter, components of the electronic device, such as a smart phone, will be described with reference to FIGS. 1 and 2.

As illustrated in FIG. 1, a touch screen 11 may be disposed in the center of the front surface of the electronic device 10. The touch screen 11 may occupy most of the front surface of the electronic device 10. The main home screen is the first screen that is displayed on the touch screen 11 when the electronic device 10 is turned on. Further, in cases where the electronic device 10 has several pages of different home screens, the main home screen may be the first of the several pages of home screens. On the home screen, shortcut icons for executing frequently used applications, a main menu switch key, time, weather, or the like may be displayed. The main menu switch key may display a menu screen on the touch screen 11. A status bar 11*d* for displaying statuses, such as a battery charging status, strength of a received signal, and current time, may also be formed on the upper end of the touch screen 11. A home key 11*a*, a menu button 11*b*, and a back button 11*c* may be formed on the lower side of the touch screen 11.

The home key 11*a* displays the main home screen on the touch screen 11 when the home key 11*a* is touched in a state where any home screen different from the main home screen or the menu screen is displayed. Further, when the home key 11*a* is touched while applications are being executed on the touch screen 11, the main home screen may be displayed on the touch screen 11. Also, the home button 11*a* may also be used to display recently used applications or a task manager on the touch screen 11. The menu button 11*b* may provide a connectivity menu that may be used on the touch screen 11, and the connectivity menu may include a widget addition menu, a background switching menu, a search menu, an editing menu, an environment setting menu, etc. The back button 11*c* may display the screen executed just before the currently executed screen, or may terminate the most recently used application.

The electronic device 10 may include a first camera 12*a*, an illuminance sensor 12*b*, and/or a proximity sensor 12*c* in the upper end area of the front surface thereof.

As illustrated in FIG. 2, the electronic device 10 may include a second camera 13*a*, a flash 13*b*, and/or a speaker 13*c* on the rear surface thereof. If the electronic device 10 includes a battery pack that is detachable, the bottom surface of the electronic device 10 may be a detachable battery cover 15.

Figure 3:
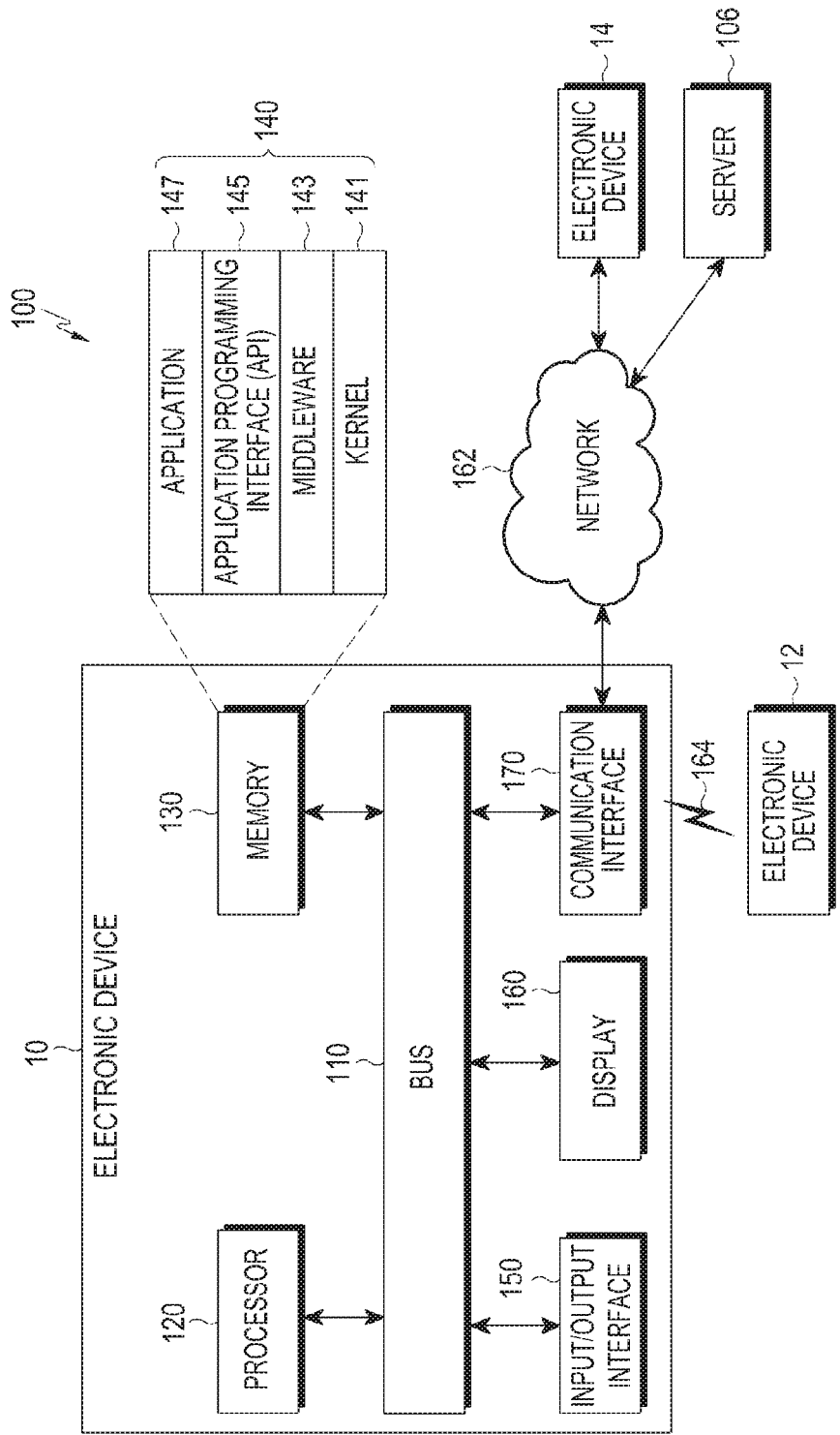
FIG. 3 is a block diagram of a network environment that includes the electronic device, according to an embodiment of the present disclosure.

The electronic device 10 will be described with reference to FIG. 3. The electronic device 10 includes a bus 110, a processor 120, a memory 130, an input/output interface 150, a display 160, and a communication interface 170. The electronic device 10 may omit at least one of the elements, or may further include other elements.

The bus 110 may include, for example, a circuit that interconnects the components 110 to 170 and delivers communication (for example, a control message and/or data) between the components.

The processor 120 may include one or more of a central processing unit (CPU), an application processor (AP), and a communication processor (CP). The processor 120, for example, may carry out operations or data processing relating to the control and/or communication of at least one other element of the electronic device 10.

The memory 130 may include a volatile and/or nonvolatile memory. The memory 130 may store, for example, instructions or data relevant to at least one other element of the electronic device 10. The memory 130 may store software and/or a program 140. The program 140 may include, for example, a kernel 141, middleware 143, an application programming interface (API) 145, and/or application programs (or "applications") 147. At least some of the kernel 141, the middleware 143, and the API 145 may be referred to as an operating system (OS).

The kernel 141 may control or manage system resources (for example, the bus 110, the processor 120, or the memory 130) that are used to execute operations or functions implemented by the other programs (for example, the middleware 143, the API 145, or the application programs 147). Furthermore, the kernel 141 may provide an interface through which the middleware 143, the API 145, or the application programs 147 may access the individual elements of the electronic device 10 to control or manage the system resources.

The middleware 143 may serve as an intermediary that allows the API 145 or the application programs 147 to communicate with the kernel 141 to exchange data.

Furthermore, the middleware 143 may process one or more task requests received from the application programs 147 according to the priorities thereof. For example, the middleware 143 may assign priorities for using the system resources (e.g., the bus 110, the processor 120, the memory 130, etc.) of the electronic device 10 to one or more of the application programs 147. The middleware 143 may perform scheduling or loading balancing on the one or more task requests by processing the one or more task requests according to the priorities assigned to the one or more application programs.

The API 145, which is an interface through which the applications 147 control functions provided from the kernel 141 or the middleware 143, may include at least one interface or function (e.g., instruction) for file control, window control, image processing, text control, etc.

The input/output interface 150 may serve as an interface that can forward instructions or data input from a user or an external device to the other element(s) of the electronic device 10. Furthermore, the input/output interface 150 may output, to the user or the external device, instructions or data received from the other element(s) of the electronic device 10.

Examples of the display 160 may include a liquid crystal display (LCD), a light-emitting diode (LED) display, an organic light-emitting diode (OLED) display, a microelectromechanical Systems (MEMS) display, and an electronic paper display. The display 160 may display various types of content (for example, text, images, videos, icons, symbols, etc.) for a user. The display 160 may include a touch screen and may receive, for example, a touch, gesture, proximity, or hovering input using an electronic pen or a part of a user's body.

The communication interface 170 may configure communication between the electronic device 10 and a first external electronic device 102, a second external electronic device 104, or a server 106. The communication interface 170 may be connected to a network 162 through wireless or wired communication to communicate with the second external electronic device 104 or the server 106.

The wireless communication may use at least one of long term evolution (LTE), LTE-Advance (LTE-A), code division multiple access (CDMA), wideband CDMA (WCDMA), universal mobile telecommunications system (UMTS), Wireless Broadband (WiBro), global system for mobile communications (GSM), and the like as a cellular communication protocol. In addition, the wireless communication may include short range communication 164. The short range communication 164 may include at least one of wireless-fidelity (WiFi), bluetooth (BT), near field communication (NFC), global navigation satellite system (GNSS), etc. The GNSS may include, for example, at least one of a global positioning system (GPS), a global navigation satellite system (Glonass), a Beidou navigation satellite system (Beidou), and Galileo (European global satellite-based navigation system) according to a place of usage, a bandwidth, etc. Hereinafter, "GPS" may be interchangeably used with the "GNSS". The wired communication may include at least one of a universal serial bus (USB), a high definition multimedia interface (HDMI), recommended standard 232 (RS-232), a plain old telephone service (POTS), etc. The network 162 may include at least one of a communication network such as a computer network (e.g., a local area network (LAN) or a wide area network (WAN)), the Internet, and a telephone network.

Each of the first and second external electronic devices 12 and 14 may be of the same or a different type from the electronic device 10. The server 106 may include a group of one or more servers. All or some of the operations performed by the electronic apparatus 10 may be performed by another electronic device or the electronic devices 12 and 14 or the server 106. When the electronic device 10 has to perform some functions or services automatically or in response to a request, the electronic device 10 may request the electronic device 12 or 14 or the server 106 to perform at least some functions relating thereto instead of, or in addition to, performing the functions or services by itself. The electronic device 12 or 14 or the server 106 may perform the requested functions or the additional functions and may deliver the execution result to the electronic device 10. The electronic device 10 may provide the received result as it is, or may additionally process the received result to provide the requested functions or services. To this end cloud computing, distributed computing, or client-server computing technology may be used.

The electronic device 10 may be one of a wearable device, a notebook computer, a net-book computer, a smart phone, a tablet PC, a Galaxy Tab™, an I-Pad™, and a wireless charging device mentioned above. The electronic device 10 may be a smart phone.

The wireless charging device refers to a device that recharges the electronic device 10 by wirelessly transmitting and receiving power in a short range.

In addition, the display unit of the electronic device 10 may become larger and may implement a luxurious design by minimizing the bezel area thereof, or may be implemented to be flexible, convex, or concave.

That is, the peripheral portion of the display unit 160 may be bent to allow the view area to extend to the bezel. As the view area of the display unit is bent to extend to the bezel, the view area may be enlarged, a separate screen may be used on the bezel, or a luxurious design may be implemented. In other words, the display unit may include a first view area and second view areas on opposite sides of the first view area.

In addition, a camera lens module 20 included in the electronic device 10 may photograph and store images and may be generally used in a cell phone or a portable mobile device included in a notebook computer.

The configuration of the camera lens module 20 provided in the electronic device 10 will be described below in detail.

Figure 4:
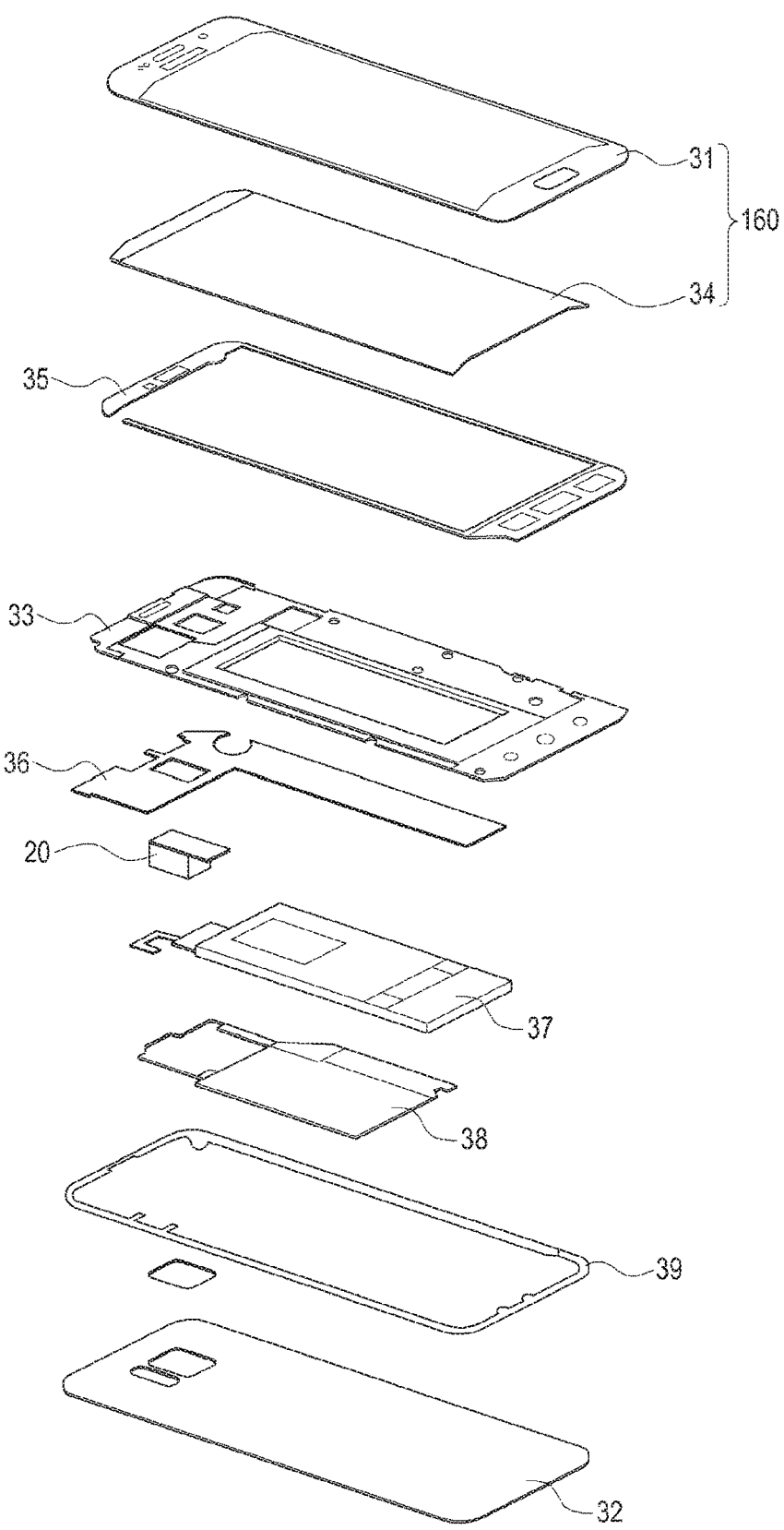
FIG. 4 is an exploded view with parts separated of the electronic device that includes a camera lens module, according to an embodiment of the present disclosure.

FIG. 4 is an exploded perspective view with parts separated of the electronic device that includes the camera lens module 20, according to an embodiment of the present disclosure.

At least one seal member 35 and the display 160, which includes a display module 34 and a front cover 31, may be sequentially stacked on the top of a housing 33 of the electronic device 10.

A printed circuit unit 36 (for example, a printed circuit board (PCB), an FLEXIBLE PRINTED CIRCUIT (FPC) etc.), a battery pack 37, a wireless power transmitting/receiving member 38, a rear seal member 39, and a rear cover 32 may be sequentially stacked on the bottom of the housing 33 of the electronic device 10.

The battery pack 37 may be received in a receiving space that is formed in the housing 33 for the battery pack 37 and may be disposed so as to not overlap the printed circuit unit 36. The battery pack 37 and the printed circuit unit 36 may be disposed in parallel without overlapping each other.

The camera lens module 20 may photograph external images in a state in which one surface thereof is disposed on the lower portion of the printed circuit unit 36, and an opposite surface thereof is disposed on the rear cover 32 having an opening formed therein such that a lens is exposed through the opening.

Figure 5:
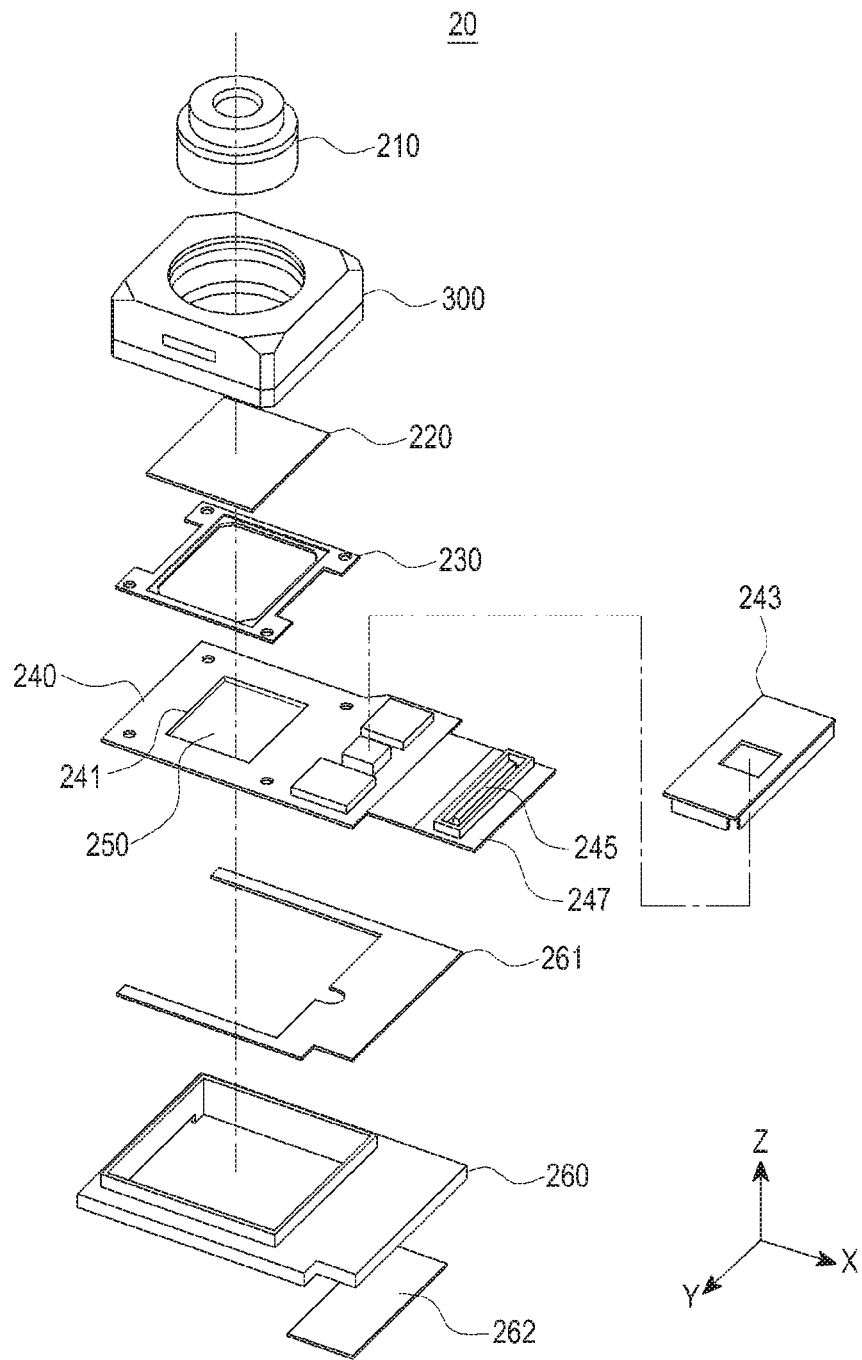
FIG. 5 is an exploded view with parts separated illustrating the configuration of the camera lens module, according to an embodiment of the present disclosure.

FIG. 5 is an exploded perspective view with parts separated illustrating the configuration of the camera lens module, according to an embodiment of the present disclosure.

As illustrated in FIG. 5, a metal member 230 having a bracket shape and guiding an infrared (IR) filter 220 and an auto-focus driving unit 330 that accommodates a lens unit 210 and the IR filter 220 seated on the metal member 230 are sequentially stacked on the top of a printed circuit board (PCB) 240 of the camera lens module 20 that has an opening 241.

An image sensor 250 may be received and positioned in the opening 241 of the PCB 240. An image sensor carrier may be further included in the opening 241 of the PCB 240 such that the image sensor 250 is received in, and supported by, the PCB 240. Accordingly, a separate component is not required for receiving the image sensor 250 in the PCB 240 so that the electronic device 10 can achieve compactness or slimness by decreasing the thickness of thereof, as well as reducing the manufacturing cost of the electronic device 10.

Various components required for driving the camera lens 210 and storing images may be mounted on a side of the image sensor 250 positioned in the opening 241 of the PCB 240. The components may include, for example, a flash memory, a gyro sensor, an auto-focus driver IC (OIS-driver IC), and the like. The components may be enclosed by a metal shield can 243.

A connector 245 connected with other components of the electronic device 10 and a conductive tape 247 disposed below the connector 245 may be provided on a side of the image sensor 250 positioned in the opening 241 of the PCB 240.

The IR filter 220 may block a portion of light input to the camera lens module 20, which has a wavelength shorter than that of a red color of visible light.

The lens unit 210 may be driven in a first direction ("X- or Y-axis" direction) or in a second direction ("Z-axis" direction) by the auto-focus driving unit 330.

The camera lens module 20 may include a base plate 260 provided below the PCB 240 having the opening 241 to support the PCB 240. The base plate 260 may be formed of a metal material. Furthermore, double-sided tapes 261 and 262 may be disposed between the base plate 260 and the PCB 240, and may also be disposed on the bottom of the base plate 260.

Figure 6:
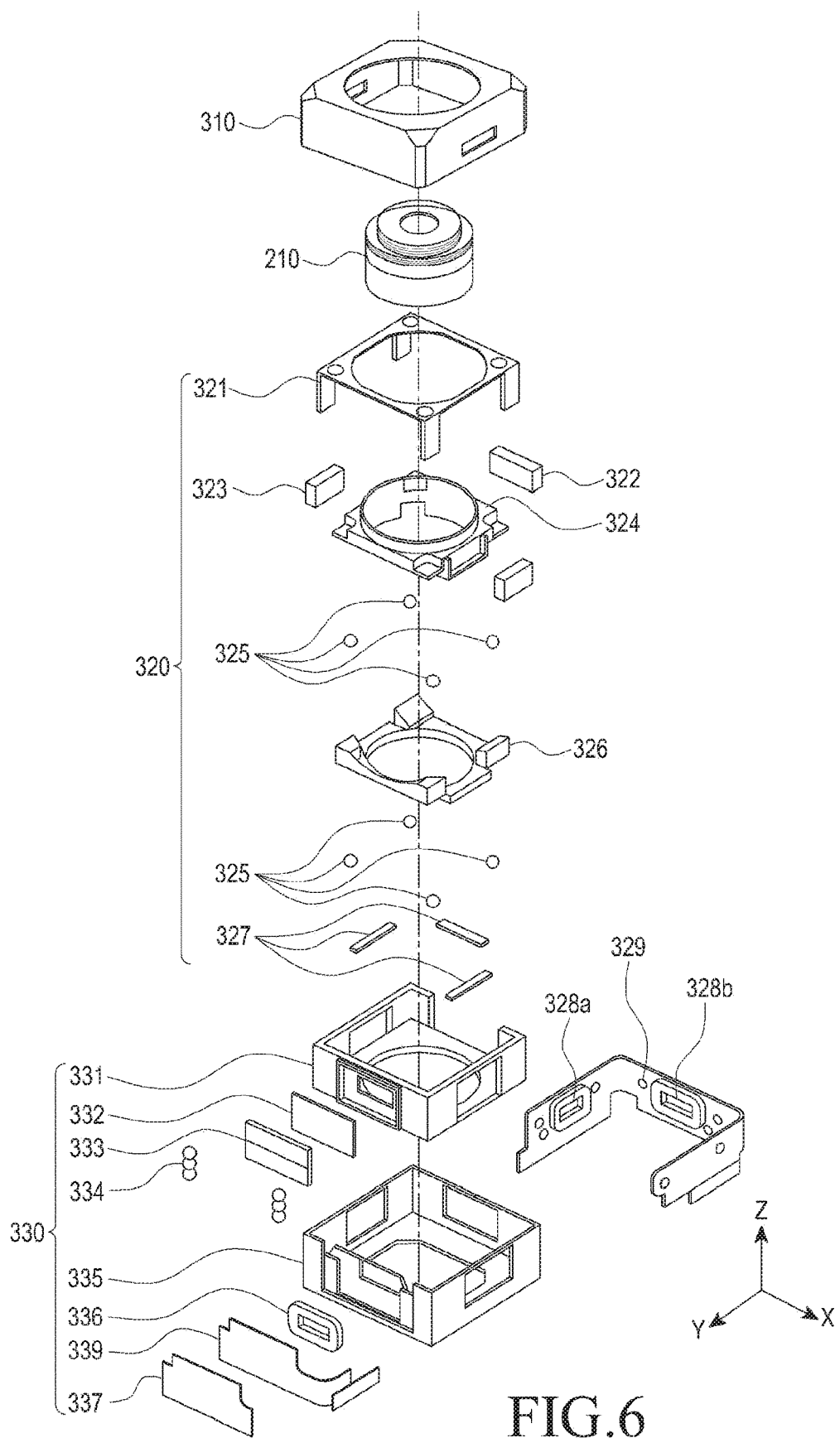
FIG. 6 is an exploded view with parts separated illustrating the configuration of a camera lens driving unit of the camera lens module, according to an embodiment of the present disclosure.

FIG. 6 is an exploded perspective view with parts separated illustrating the configuration of a camera lens driving unit 300 of the camera lens module 20, according to an embodiment of the present disclosure.

In FIG. 6, the "Z-axis" refers to the vertical direction of the camera lens module 20 (that is, an optical axis along which a lens carrier 211 moves), the "X-axis" refers to the lateral direction of the camera lens module 20 (the left and right direction with respect to the optical axis), and the "Y-axis" refers to the longitudinal direction of the camera lens module 20 (the direction perpendicular to the optical axis and the X-axis). An auto-focus driving unit 330, which will be described below, moves the lens carrier 211 along the optical axis (Z-axis) to provide a driving force for adjusting a focus, and an optical image stabilizer (OIS) driving unit 320 drives an OIS carrier 324. in the X- and Y-axis directions to provide a driving force for compensating for horizontal balance.

As illustrated in FIG. 6, the camera lens driving unit 300 may include a lens unit 210, the lens carrier 211, first and second flexible circuit boards 329 and 339, an auto-focus carrier 331, the auto-focus driving unit 330, the OIS carrier 324, and the OIS driving unit 320.

The OIS driving unit 320 may be provided between the OIS carrier 324 and a base 335 to compensate for shaking of the lens carrier 211 in the left and right direction (the X- and Y-axis directions).

The OIS driving unit 320 may include first magnets 322 and 323, the first flexible circuit board 329, a plurality of first coils 328a and 328b, a Hall sensor, and one or more rolling parts.

The lens carrier 211 may have a lens 212 therein and may be provided inside the base 335 while being coupled through the OIS carrier 324 in order to drive the lens 212 in the optical axis (Z-axis) direction.

The first and second flexible circuit boards 329 and 339 may be disposed on the base 335 to surround the base 335. The two first coils 328a and 328b on the inside of the first flexible circuit board 329 may face the first magnets 322 and 323, and the Hall sensor may be disposed on the inside of the first flexible circuit board 329. A second coil 336 may be disposed on the inside of the second flexible circuit board 339 to face a second magnet 333.

The plurality of magnets 322 and 323 may be provided on one surface of the OIS carrier 324 to face the first coils 328a and 328b and to face the second coil 336, which will be described below. A support plate 326 may be provided on the side surface of the OIS carrier 324 to fix and support the plurality of magnets 322 and 323.

The first flexible circuit board 329 may be coupled to the outside of the base 335, and the rolling parts may be mounted on the support plate 326 to support the OIS carrier 324 to allow the OIS carrier 324 to move in the left and right direction (X- and Y-axis directions) for an OIS function.

As described above, the one or more first coils 328a and 328b may be disposed on the first flexible circuit board 329, and the Hall sensor may be disposed on the first flexible circuit board 329 and may be located between the first coils 328a and 328b.

The rolling parts may be constituted by ball bearings 325 to make rolling the OIS carrier 324 possible. Furthermore, a plurality of yokes 327 are disposed on the bottom of the support plate 326 to separate the OIS carrier 324 from the side surfaces of the base 335 and to center the OIS carrier 324 in the base 335.

The yokes 327 may be disposed below, or on sides of, the first magnets 322 and 323 while facing the first magnets 322 and 323. Accordingly, in a case where the OIS carrier 324 is not centered when the OIS carrier 324 is driven, the yokes 327 may return the OIS carrier to the center of the optical axis (Z-axis) by means of the magnetic forces of the magnets.

In other words, active alignment of the OIS carrier 324 may be separately performed. The active alignment refers to an alignment method of fixing the OIS carrier 324 to the center of the optical axis (Z-axis) after initially aligning the camera lens module.

A stopper 321 may be coupled to the base 335 to restrict the lens carrier 211 from moving along the optical axis (Z-axis) and to prevent separation of the lens carrier 211.

The auto-focus driving unit 330 may be disposed between the lens carrier 211 and the base 335 to automatically adjust the focus of the lens while moving the lens carrier 211 along the optical axis (Z-axis).

The auto-focus driving unit 330 may include the lens unit 210, the second flexible circuit board 339, the at least one second coil 336, the Hall sensor, and the auto-focus carrier 331.

The lens unit 210 may be provided within the lens carrier 211 to move together with the lens carrier 211 in the optical axis (Z-axis) direction. The second flexible circuit board 339 applies a current to the second coil 336. The second flexible circuit board 339 is provided with the Hall sensor for recognizing positions to which the magnets move, and is coupled to the outer surface of the base 335 while surrounding the same.

The second coil 336 is provided on the inside of the second flexible circuit board 339 or in a side surface of the base 335 and faces the at least one second magnet 333.

For example, the second coil 336 may be provided on one surface of the second flexible circuit board 339 to face the second magnet 333, and a plurality of yokes 332 and 337 may be provided on the front and rear surfaces of the second flexible circuit board 339 to face one surface of the at least one second magnet 333.

Furthermore, a resilient member may be electrically connected with the first and second flexible circuit boards 329 and 339 and may provide a resilient force to move the lens carrier 211 along the optical axis (Z-axis).

Bearings 334 may be disposed on a side surface of the base 335 such that the lens unit 210 may move by means of an interaction between the second magnet 333 and the second coil 336.

Figure 7:
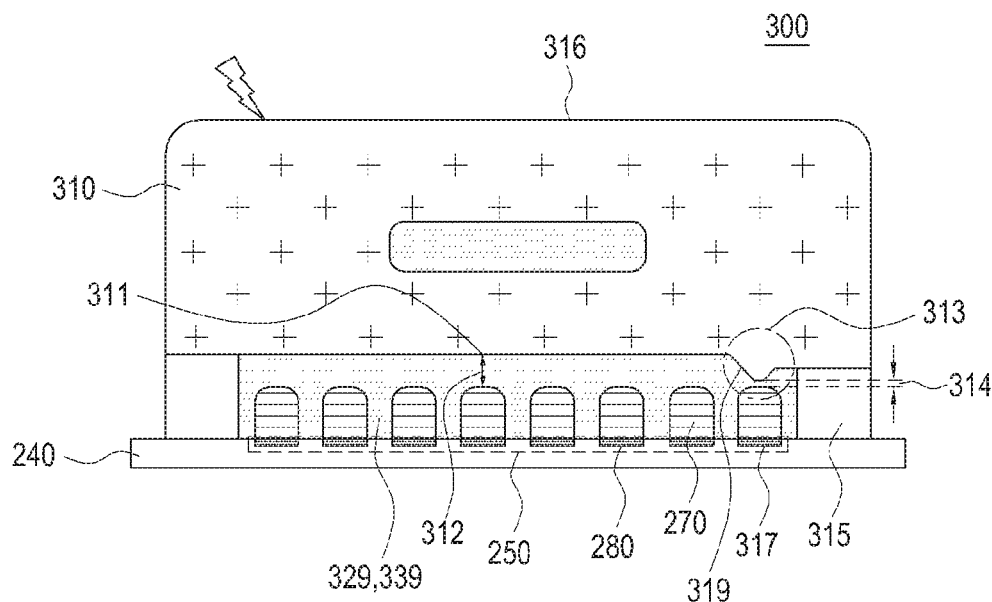
FIGS. 7 to 14 are front views illustrating a shape of a metal casing of the camera lens driving unit, according to an embodiment of the present disclosure.

FIG. 7 is a front view illustrating a shape of a metal casing of the camera lens driving unit 300, according to an embodiment of the present disclosure.

The electronic device 10 includes a PCB 240 having one or more terminals 270 formed thereon, an image sensor 250 electrically connected with the terminals 270, the metal casing 310 enclosing one surface of the image sensor 250, and flexible circuit boards 329 and 339 disposed on the inner surface of the metal casing 310.

The PCB 240 may be disposed on the lower portion of the metal casing 310 and may be provided with the one or more terminals 270 arranged with a predetermined interval therebetween. The one or more terminals 270 may be overlaid with solder, and terminal pads 280 may be disposed below the respective terminals 270 to support the same.

The terminals 270 may be formed on the flexible circuit boards 329 and 339 and may be connected with the PCB 240 through the terminal pads 280 to provide paths through which electricity passes. For example, the side surfaces of the terminals 270 may face the flexible circuit boards 329 and 339, and the lower surfaces of the terminals 270 may face the PCB 240.

The image sensor 250 may be received and positioned in an opening of the PCB 240. FIG. 7 illustrates the image sensor 250 disposed within the PCB 240. The image sensor 250 may detect information of a subject photographed through the camera lens unit 210 and may convert the information into an electrical image signal. The image sensor 250 may be electrically connected with the one or more terminals 270 to transmit the image signal.

The metal casing 310 may have a housing shape or configuration and may be disposed on the PCB 240 to protect the camera lens driving unit 300 mounted on the PCB 240 from an external electric shock. The metal casing 310 may be formed of metal or other suitable material and may be, for example, a shield can.

The metal casing 310 may include a first portion 311 and a second portion 313 that have different shapes.

The first portion 311 may correspond to one surface of the metal casing 310 and may be formed to be spaced apart from the PCB 240 by a first distance 312. Further, the second portion 313 may correspond to one surface of the metal casing 310 and may be formed to be spaced apart from the PCB 240 by a second distance 314. The first distance 312 and the second distance 314 may differ from each other.

The first portion 311 of the metal casing 310 may be substantially formed to be in line on a plane. For example, the first portion 311 may include one surface formed parallel to the flat upper surface 316 of the metal casing 310 and may maintain a predetermined distance (the first distance 312) from the one or more terminals 270.

The second portion 313 of the metal casing 310 may have a curved portion 319 that protrudes from the metal casing 310. For example, the second portion 313 may be formed such that a predetermined area protrudes downward from the metal casing 310. The protruding second portion 313 may be formed above at least one terminal 270 and may form the second distance 314 that corresponds to the distance between the terminal 270 and the protruding second portion 313.

The second distance 314 between the second portion 313 and the terminal 270 may be shorter than the first distance 312 between the first portion 311 and the terminal 270. Accordingly, an electrical guide structure that facilitates electrical discharge of the terminal 270 may be achieved by virtue of the second distance 314 formed by the second portion 313 rather than the first distance 312 formed by the first portion 311.

The protruding shape of the second portion 313 may be obliquely formed to be sharp toward the lower side thereof; this is because the density of an electric field increases as the lower portion of the protruding shape becomes narrower so that an electrical guide structure that facilitates discharge can be achieved.

Furthermore, the terminal 270, which forms the second distance 314 together with the second portion 313, may serve as a path for transmitting ground, DC power, and an image signal and may be disposed in the outermost position in order to minimize transmission of electricity, which is guided through discharge between the metal casing 310 and a ground terminal, to another terminal.

In the related art, electricity introduced into the electronic device 10 from the outside may be transmitted to the camera lens module, which is made of high-conductive metal and is close to, or protrudes from, the outer surface of the electronic device, to cause noise or performance degradation in electronic components within the camera lens module, thereby resulting in malfunction or damage.

The second portion 313 of the metal casing 310 of the present disclosure may allow static electricity introduced into the metal casing 310 to be easily transmitted to the PCB 240 through the second portion 313 to directly induce discharge, thereby protecting the camera lens module 20.

The first distance 312 and the second distance 314 may be described as distances considering electrical charges rather than physical distances. For example, electrical charges move through an electric field, and the density of the electric field needs to be increased in order to facilitate the movement of the electrical charges. Movement of an electrical charge according to the density of an electric field depending on permittivity and distance in accordance with the following equations will be described.

Equations (1)-(3) depend on permittivity and distance.

$$D = \varepsilon \frac{V}{d} \quad (1)$$

$$\vec{D} = \varepsilon \vec{E} \quad (2)$$

$$E = \frac{V}{d} \quad (3)$$

In Equations (1)-(3), E (electric field strength) has a unit of [N/C] and represents the strength of an electric field experienced by a unit positive charge, and may be defined as a value varying according to a medium. D (electric flux density) has a unit of [C/m2] and represents the number of electric lines of force passing through a unit area, and may be defined as a value irrelevant to a medium. ε denotes permittivity, V denotes voltage, and d denotes the first or second distance.

Referring to the equations above, an electrical charge moves to a side where D (electric flux density) is high. Accordingly, the shape of the metal casing 310 capable of raising D (electric flux density) needs to be manufactured in order to induce discharge in the present disclosure.

Since it may be assumed that the same potential difference caused by static electricity is applied to the metal casing 310 and the ground, a specific section (the second portion) may be formed in the metal casing 310 using the concept of a ratio of permittivity to distance rather than the concept of a physical distance. Accordingly, since discharge is easily generated to a side having a high electric flux density D, it is important to increase the ratio of permittivity to distance, and in the case of the same permittivity, the second portion 313 formed to be spaced a short distance apart from the terminal 270 may easily induce discharge.

When permittivity ε is equivalent to voltage V, the second portion 313 and the first portion 311 may be provided such that the ratio of the second distance 314 to the first distance 312 ranges from 1/2.7 to 1/3.3, as set forth in Equation (3).

The first distance 312 may range from 2.7 mm to 3.3 mm, and the second distance 314 may range from 0.8 mm to 1.2 mm.

Without being limited to the numeral values, however, the first distance 312 and the second distance 314, which are different from each other, may be diversely set to maintain the charge density difference described above.

Furthermore, in a state in which a terminal and ground (GND) are at the same distance, an object having high permittivity may be added therebetween to facilitate discharge.

Figure 14:
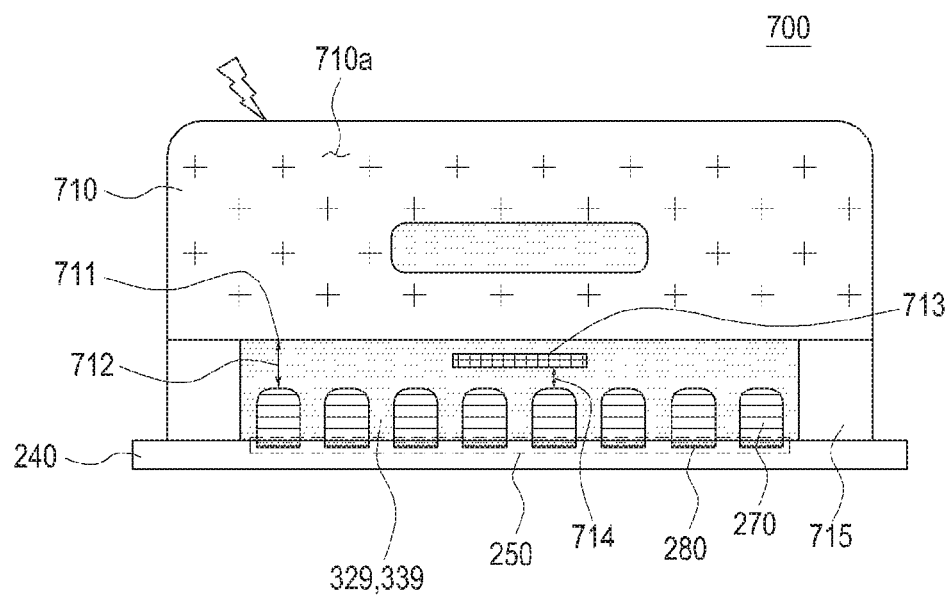

Moreover, referring to FIG. 14, when a terminal 280 and the ground are disposed at the same distance, an object having high permittivity ε may be disposed between the terminal 280 and the ground to easily induce discharge.

The flexible circuit boards 329 and 339 may be disposed within the metal casing 310 to transmit electricity to the camera lens driving unit 300. The flexible circuit boards 329 and 339 may be disposed between the metal casing 310 and the base 335 so as to be surrounded thereby, and may include the first flexible circuit board 329 and the second flexible circuit board 339, as shown in FIG. 5.

The first flexible circuit board 329 and the second flexible circuit board 339 may be connected with the PCB 240 through the terminals 270 and may transmit electrical signals to the OIS driving unit 320 and the auto-focus driving unit 330.

The flexible circuit boards 329 and 339 may be fixed to partial areas of the side surfaces of the terminals 270 using a resin 315.

Figure 8:
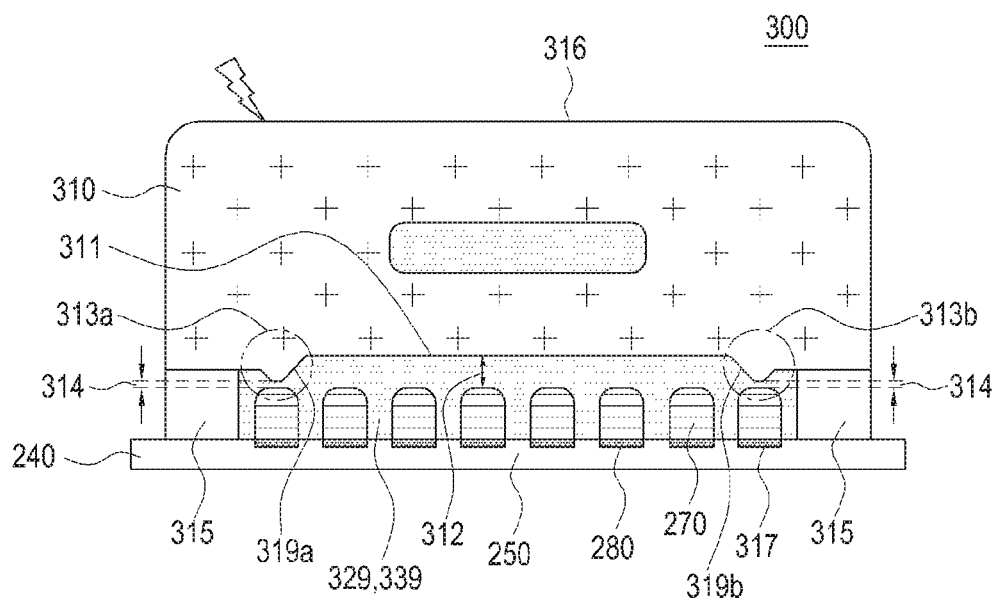

FIG. 8 is a front view illustrating the shape of a metal casing of the camera lens driving unit 330, according to an embodiment of the present disclosure.

The electronic device 10 includes a PCB 240 having one or more terminals 270 formed thereon, an image sensor 250 electrically connected with the terminals 270, the metal casing 310 enclosing one surface of the image sensor 250, and flexible circuit boards 329 and 339 disposed on the inner surface of the metal casing 310.

Since the PCB 240, the image sensor 250, and the flexible circuit boards 329 and 339 have the same structure and arrangement, only the structure of the metal casing 310 will be described below.

The metal casing 310 may include a first portion 311 and a second portion 313 that have different shapes.

The first portion 311 may correspond to one surface of the metal casing 310 and may be formed to be spaced apart from the PCB 240 by a first distance 312. Further, the second portion 313 may correspond to one surface of the metal casing 310 and may be formed to be spaced apart from the PCB 240 by a second distance 314. The first distance 312 and the second distance 314 may differ from each other.

The second portion 313 of the metal casing 310 may have curved portions 319 that protrude from the metal casing 310. For example, the second portion 313 may be formed such that a predetermined area protrudes downward from the metal casing 310. The protruding second portion 313 may be formed above at least one terminal 270 and may form the second distance 314 that corresponds to the distance between the terminal 270 and the protruding second portion 313.

The second portion 313 may include a first curved portion 319a and a second curved portion 319b. The first curved portion 319a and the second curved portion 319b may have the same shape and may be disposed symmetric relative to each other and with respect to the metal casing 310.

The second distance 314 between the terminals 270 and the lower ends of the first and second curved portions 319a and 319b of the second portion 313 may be shorter than the first distance 312 between the first portion 311 and the terminals 270. Accordingly, an electrical guide structure that facilitates electrical discharge of the terminals 270 may be achieved by virtue of the second distance 314 formed by the second portion 313 rather than the first distance 312 formed by the first portion 311.

Each of the first and second curved portions 319a and 319b may be obliquely formed to be sharp toward the lower side thereof; this is because the density of an electric field increases as the lower portions of the protruding shapes become narrower so that an electrical guide structure that facilitates discharge can be achieved.

Accordingly, the second portion 313 of the metal casing 310 may allow static electricity introduced into the metal casing 310 to be transmitted to the PCB 240 through the second portion 313 to directly induce discharge, thereby protecting the camera lens module 20.

Although the two curved portions 319a and 319b and the terminals 270 corresponding thereto and disposed on two ground pads 317 have been described, the present disclosure is not limited thereto, and three or more curved portions and as many terminals as the number corresponding thereto, which are grounded to the ground, may be easily implemented to easily induce discharge.

Figure 9:
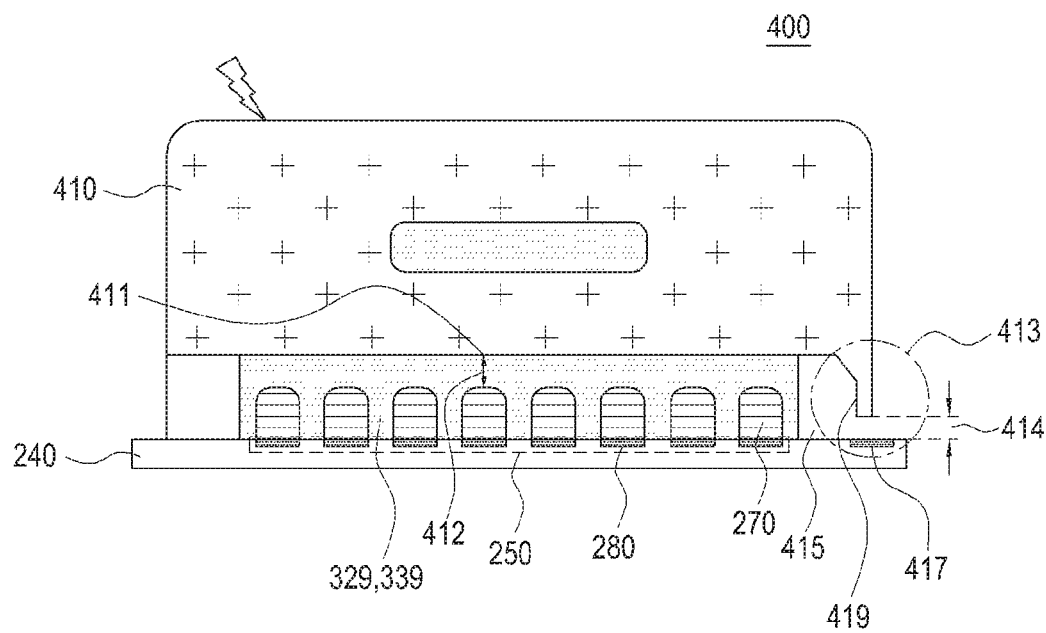

FIG. 9 is a front view illustrating another shape of a metal casing of the camera lens driving unit 330, according to an embodiment of the present disclosure.

The electronic device 10 may include a PCB 240 having one or more terminals 270 formed thereon, an image sensor 250 electrically connected with the terminals 270, the metal casing 410 enclosing one surface of the image sensor 250, flexible circuit boards 329 and 339 disposed on the inner surface of the metal casing 410, and a ground pad 417 exposed to the outside of the metal casing 410.

The PCB 240 may be disposed on the lower portion of the metal casing 410 and may be provided with the one or more terminals 270 arranged with a predetermined interval therebetween. The one or more terminals 270 may be overlaid with solder, and terminal pads 280 may be disposed below the respective terminals 270 to support the same. The ground pad 417 may be separately disposed outside the metal casing 410 so as to be spaced a predetermined distance (second distance) apart from the metal casing 410, in addition to the terminal pads 280 disposed below the terminals 270.

The terminals 270 may be formed on the flexible circuit boards 329 and 339 and may be connected with the PCB 240 through the terminal pads 280 to provide paths through which electricity passes. For example, the side surfaces of the terminals 270 may face the flexible circuit boards 329 and 339, and the lower surfaces of the terminals 270 may face the PCB 240.

Since the arrangement and shapes of the image sensor 250 and the flexible circuit boards 329 and 339 are the same as those in the above-described embodiments, a description thereof will be omitted. Hereinafter, the structure of the metal casing 410 and the associative relation between the metal casing 410 and the ground pad 417 will be described in detail.

The metal casing 410 may have a housing and may be disposed on the PCB 240 to protect a camera lens driving unit 400 mounted on the PCB 240 from an external electric shock. The metal casing 410 may be formed of metal and may be, for example, a shield can.

The metal casing 410 may include a first portion 411 and a second portion 413 that have different shapes.

The first portion 411 may correspond to one surface of the metal casing 410 and may be formed to be spaced apart from the PCB 240 by a first distance 412.

The second portion 413 of the metal casing 410 may have a curved portion 419 protruding from the metal casing 410 by a predetermined distance. For example, the second portion 413 may be formed such that a predetermined area protrudes downward from the metal casing 410. The curved portion 419 of the second portion 413 may be formed above the ground pad 417 and may form a second distance 414 that corresponds to the distance between the ground pad 417 and the protruding second portion 413.

The second distance 414 between the second portion 413 and the ground pad 417 may be shorter than the first distance 412 between the first portion 411 and the terminals 270. Accordingly, an electrical guide structure that facilitates electrical discharge of the terminals 270 may be achieved by virtue of the second distance 414 formed by the second portion 413 rather than the first distance 412 formed by the first portion 411.

The protruding shape of the second portion 413 may be obliquely formed to be sharp toward the lower side thereof;

this is because the density of an electric field increases as the lower portion of the protruding shape becomes narrower so that an electrical guide structure that facilitates discharge can be achieved.

At least one ground pad 417 may be disposed on the PCB 240 and may be disposed below the side boundary surface of the metal casing 410 so as to be spaced apart from a part of the metal casing 410 by the second distance 414. A part of the ground pad 417 may be exposed to the outside of the metal casing 410 and may be spaced apart from the metal casing 410 by a distance shorter than the first distance 412 to allow electricity introduced from the outside to be easily discharged from the camera lens module to the outside.

Accordingly, the second portion 413 of the metal casing 410 may allow static electricity introduced into the metal casing 410 to be transmitted to the PCB 240 through the second portion 413 to directly induce discharge, thereby protecting the camera lens module 20.

Figure 10:
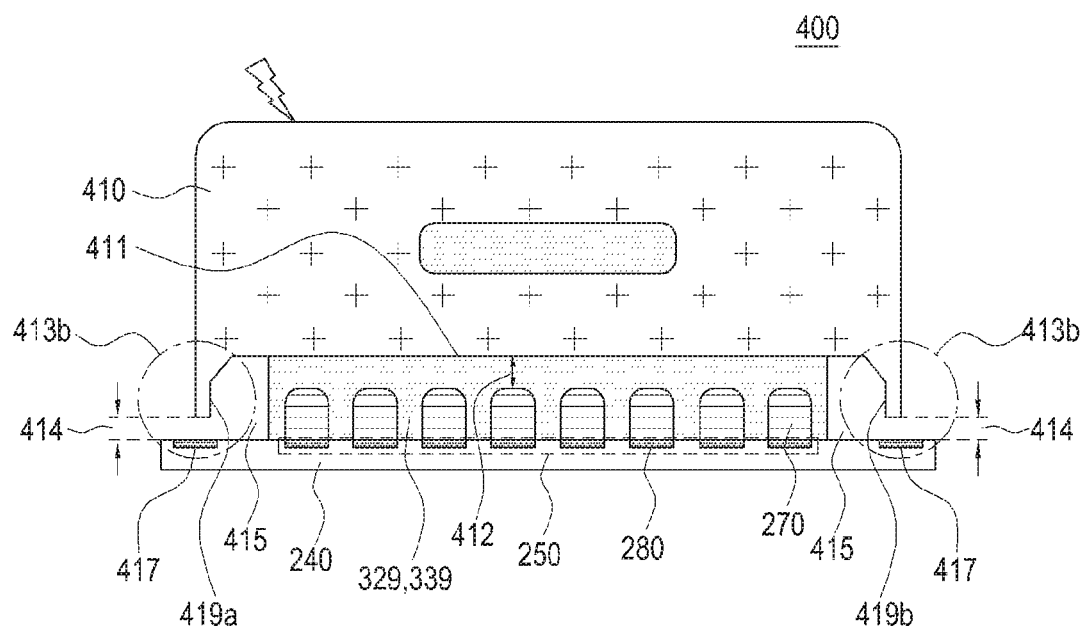

FIG. 10 is a front view illustrating the shape of a metal casing of the camera lens driving unit, according to an embodiment of the present disclosure.

The electronic device 10 includes a PCB 240 having one or more terminals 270 formed thereon, an image sensor 250 electrically connected with the terminals 270, the metal casing 410 enclosing one surface of the image sensor 250, flexible circuit boards 329 and 339 disposed on the inner surface of the metal casing 410, and a plurality of ground pads 417 exposed to the outside of the metal casing 410.

Since the PCB 240, the image sensor 250, and the flexible circuit boards 329 and 339 have the same structure and arrangement, only the structure of the metal casing 410 will be described below.

The metal casing 410 may include a first portion 411 and a second portion 413 that have different shapes.

The first portion 411 may correspond to one surface of the metal casing 410 and may be formed to be spaced apart from the PCB 240 by a first distance 412. Further, the second portion 413 may correspond to one surface of the metal casing 410 and may be formed to be spaced apart from the PCB 240 by a second distance 414. The first distance 412 and the second distance 414 may differ from each other.

The second portion 413 of the metal casing 410 may have curved portions 419 protruding from the metal casing 410 by a predetermined distance. For example, the second portion 413 may be formed such that a predetermined area protrudes downward from the metal casing 410. The curved portions 419 of the second portion 413 may be formed above the ground pads 417 and may form the second distance 414 that corresponds to the distance between the ground pads 417 and the protruding second portion 413.

The second portion 413 may include a first curved portion 419a and a second curved portion 419b. The first curved portion 419a and the second curved portion 419b may have the same shape and may be disposed symmetric to each other with respect to the metal casing 410.

The second distance 414 between the ground pads 417 and the lower ends of the first and second curved portions 419a and 419b of the second portion 413 may be shorter than the first distance 412 between the first portion 411 and the terminals 270. Accordingly, an electrical guide structure that facilitates electrical discharge of the terminals 270 may be achieved by virtue of the second distance 414 formed by the second portion 413 rather than the first distance 412 formed by the first portion 411.

Each of the first and second curved portions 419a and 419b may be obliquely formed to be sharp toward the lower side thereof; this is because the density of an electric field increases as the lower portions of the protruding shapes become narrower so that an electrical guide structure that facilitates discharge can be achieved.

Two ground pads 417 may be disposed on the PCB 240 and may be disposed below the side boundary surface of the metal casing 410 so as to be spaced apart from the first and second curved portions 419a and 419b of the metal casing 410 by the second distance 414. A part of each ground pad 417 may be exposed to the outside of the metal casing 410 and may be spaced apart from the metal casing 410 by a distance shorter than the first distance 412 to allow electricity introduced from the outside to be easily discharged from the camera lens module to the outside.

Accordingly, the second portion 413 of the metal casing 410 may allow static electricity introduced into the metal casing 410 to be transmitted to the PCB 240 through the second portion 413 to directly induce discharge, thereby protecting the camera lens module 20.

Although the two curved portions and the two ground pads 417 corresponding thereto have been described above, the present disclosure is not limited thereto, and three or more curved portions and as many ground pads as the number corresponding to the curved portions may be easily implemented to easily induce discharge.

Figure 11:
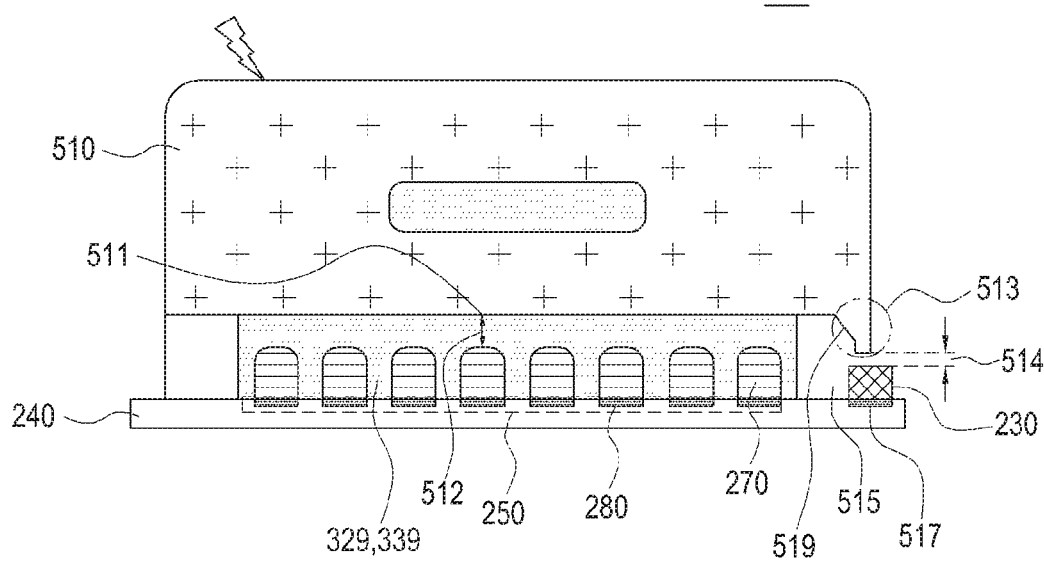

FIG. 11 is a front view illustrating another shape of a metal casing of the camera lens driving unit, according to an embodiment of the present disclosure.

The electronic device 10 includes a PCB 240 having one or more terminals 270 formed thereon, an image sensor 250 electrically connected with the terminals 270, the metal casing 510 enclosing one surface of the image sensor 250, flexible circuit boards 329 and 339 disposed on the inner surface of the metal casing 510, a ground pad 517 exposed to the outside of the metal casing 510, and a metal member 230 disposed on the ground pad 517.

The PCB 240 may be disposed on the lower portion of the metal casing 510 and may be provided with the one or more terminals 270 arranged with a predetermined interval therebetween. The one or more terminals 270 may be overlaid with solder, and terminal pads 280 may be disposed below the respective terminals 270 to support the same. The ground pad 517 may be separately disposed outside the metal casing 510 so as to be spaced a predetermined distance (second distance) apart from the metal casing 410, in addition to the terminal pads 280 disposed below the terminals 270.

Since the arrangement and shapes of the image sensor 250 and the flexible circuit boards 329 and 339 are the same as those in the above-described embodiments, a description thereof will be omitted. Hereinafter, the structure of the metal casing 510 and the associative relation between the ground pad 517 and the metal member 230 will be described in detail.

The metal casing 510 may have a housing shape and may be disposed on the PCB 240 to protect the camera lens driving unit 500 mounted on the PCB 240 from an external electric shock. The metal casing 510 may be formed of metal and may be, for example, a shield can.

The metal casing 510 may include a first portion 511 and a second portion 513 that have different shapes.

The first portion 511 may correspond to one surface of the metal casing 510 and may be formed to be spaced apart from the PCB 240 by a first distance 512.

The second portion 513 of the metal casing 510 may have a curved portion 519 protruding from the metal casing 510 by a predetermined distance. For example, the second portion 513 may be formed such that a predetermined area protrudes downward from the metal casing 510. The curved portion 519 of the second portion 513 may be formed above the metal member 230 and may form a second distance 514 that corresponds to the distance between the metal member 230 and the protruding second portion 513.

The second distance 514 between the second portion 513 and the metal member 230 may be shorter than the first distance 512 between the first portion 511 and the terminals 270. Accordingly, an electrical guide structure that facilitates electrical discharge of the terminals 570 may be achieved by virtue of the second distance 514 formed by the second portion 513 rather than the first distance 512 formed by the first portion 511.

The protruding shape of the second portion 513 may be obliquely formed to be sharp toward the lower side thereof; this is because the density of an electric field increases as the lower portion of the protruding shape becomes narrower so that an electrical guide structure that facilitates discharge can be achieved.

At least one ground pad 517 may be disposed on the PCB 240 and may be disposed below the side boundary surface of the metal casing 510 such that a part of the metal casing 510 may be spaced apart from the metal member 230 by the predetermined second distance 514, and the metal member 230 may be seated on the upper surface of the ground pad 517.

The metal member 230 may be disposed to make contact with the upper surface of the ground pad 517 and may be exposed to the outside of the metal casing 510, and the second distance 514 may be maintained to be shorter than the first distance 512 so that electricity introduced from the outside can be easily discharged from the camera lens module to the outside. The metal member 230 may be a shield can that is configured to protect other components from an external electric shock.

Accordingly, the second portion 513 of the metal casing 510 may allow static electricity introduced into the metal casing 510 to be transmitted to the PCB 240 through the second portion 513 to directly induce discharge, thereby protecting the camera lens module 20.

Figure 12:
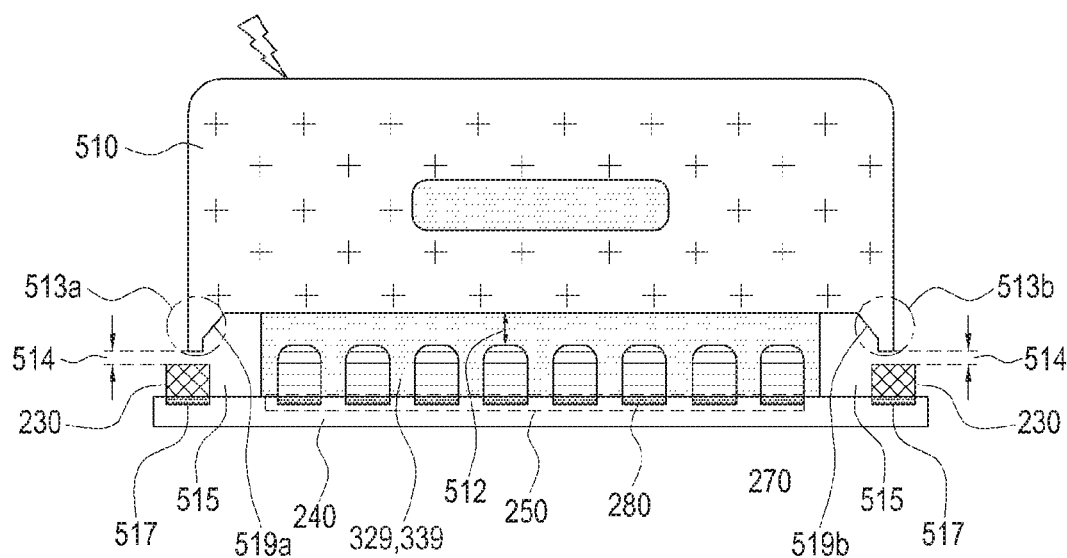

FIG. 12 is a front view illustrating the shape of a metal casing of the camera lens driving unit, according to an embodiment of the present disclosure.

The electronic device 10 includes a PCB 240 having one or more terminals 270 formed thereon, an image sensor 250 electrically connected with the terminals 270, the metal casing 510 enclosing one surface of the image sensor 250, flexible circuit boards 329 and 339 disposed on the inner surface of the metal casing 510, ground pads 517 exposed to the outside of the metal casing 510, and metal members 230 disposed on the ground pads 517.

Since the PCB 240, the image sensor 250, and the flexible circuit boards 329 and 339 have the same structure and arrangement, only the structures of the metal casing 510, the ground pads 517, and the metal members will be described below.

The metal casing 510 may include a first portion 511 and a second portion 513 that have different shapes.

The first portion 511 may correspond to one surface of the metal casing 510 and may be formed to be spaced apart from the PCB 240 by a first distance 512.

The second portion 513 of the metal casing 510 may have curved portions 519 protruding from the metal casing 510 by a predetermined distance. For example, the second portion 513 may be formed such that a predetermined area protrudes downward from the metal casing 510. The curved portions 519 of second portion 513 may be formed above the metal members 230 and may form a second distance 514 that corresponds to the distance between the metal members 230 and the protruding second portion 513.

The second portion 513 may include a first curved portion 519a and a second curved portion 519b. The first curved portion 519a and the second curved portion 519b may have the same shape and may be disposed symmetric to each other with respect to the metal casing 510.

The second distance 514 between the metal members 230 and the lower ends of the first and second curved portions 519a and 519b of the second portion 513 may be shorter than the first distance 512 between the first portion 511 and the terminals 270. Accordingly, an electrical guide structure that facilitates electrical discharge of the terminals 270 may be achieved by virtue of the second distance 514 formed by the second portion 513 rather than the first distance 512 formed by the first portion 511.

Each of the first and second curved portions 519a and 519b may be obliquely formed to be sharp toward the lower side thereof; this is because the density of an electric field increases as the lower portions of the curved portions become narrower so that an electrical guide structure that facilitates discharge can be achieved.

One or more ground pads 517 may be disposed on the PCB 240 and may be disposed below the side boundary surface of the metal casing 510 such that a part of the metal casing 510 may be spaced apart from the metal members 230 by the predetermined second distance 514, and the metal members 230 may be seated on the upper surfaces of the ground pads 517.

Two ground pads 517 may be disposed on the PCB 240 and may be disposed below the side boundary surface of the metal casing 510 such that the first and second curved portions 519a and 519b of the metal casing 510 are spaced apart from the metal members 230 by the second distance 514.

The two metal members 230 may be disposed to make contact with the upper surfaces of the ground pads 517 corresponding thereto and may be configured such that a part thereof is exposed to the outside of the metal casing 510, and the second distance 514 may be maintained to be shorter than the first distance 512 so that electricity introduced from the outside can be easily discharged from the camera lens module to the outside.

Accordingly, the second portion 513 of the metal casing 510 may allow static electricity introduced into the metal casing 510 to be transmitted to the PCB 240 through the second portion 513 to directly induce discharge, thereby protecting the camera lens module 20.

Although the two curved portions and the two metal members 230 corresponding thereto have been described above, the present disclosure is not limited thereto, and three or more curved portions and as many metal members as the number corresponding to the curved portions may be easily implemented to easily induce discharge.

Figure 13:
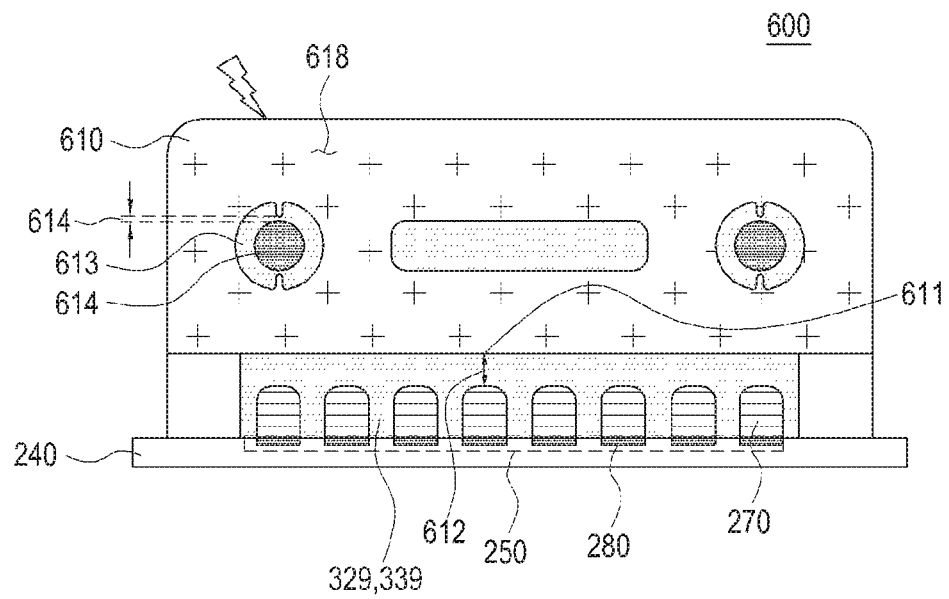

FIG. 13 is a front view illustrating the shape of a metal casing of the camera lens driving unit, according to an embodiment of the present disclosure.

The electronic device 10 includes a PCB 240 having one or more terminals 270 formed thereon, an image sensor 250 electrically connected with the terminals 270, the metal casing 610 enclosing one surface of the image sensor 250, flexible circuit boards 329 and 339 disposed on the inner surface of the metal casing 610, and a ground pad 617 exposed through an opening of the metal casing 610.

The PCB 240 may be disposed on the lower portion of the metal casing 610 and may be provided with the one or more terminals 270 arranged with a predetermined interval therebetween. The one or more terminals 270 may be overlaid with solder, and terminal pads 280 may be disposed below the respective terminals 270 to support the same.

Since the arrangement and shapes of the image sensor 250 and the flexible circuit boards 329 and 339 are the same as those in the above-described embodiments, a description thereof will be omitted. Hereinafter, the structure of the metal casing 610 and the associative relation between the metal casing 610 and the ground pad 617 will be described in detail.

The metal casing 610 may have a housing shape and may be disposed on the PCB 240 to protect the camera lens driving unit 600 mounted on the PCB 240 from an external electric shock. The metal casing 610 may be formed of metal and may be, for example, a shield can. The metal casing 610 may include a first portion 611 and a second portion 613 that have different shapes.

The first portion 611 may correspond to one surface of the metal casing 610 and may be formed to be spaced apart from the PCB 240 by a first distance 612.

The second portion 613 of the metal casing 610 may have a closed-curve shape passing through the metal casing 610 and may be disposed on the side surface 618 of the metal casing 610. Furthermore, a part of the closed-curve shape may be curved inwardly or outwardly to form a curved portion 619. For example, the second portion 613 may have a circular shape and may be disposed in the middle of the side surface 618 of the metal casing 610, and a part of the upper or lower side of the circular shape may be curved inwardly toward the center of the circular shape so as to be spaced a second distance 614 apart from the ground pad 617 disposed in the center of the circular shape.

The second distance 614 between the second portion 613 and the ground pad 617 may be shorter than the first distance 612 between the first portion 611 and the terminals 270. Accordingly, an electrical guide structure that facilitates electrical discharge of the terminals 270 may be achieved by virtue of the second distance 614 formed by the second portion 613 rather than the first distance 612 formed by the first portion 611.

The curved portion 619 of the second portion 613 may be obliquely formed to be sharp toward the inside thereof; this is because the density of an electric field increases as the lower portion of the curved portion 619 becomes narrower so that an electrical guide structure that facilitates discharge can be achieved.

Two or more second portions 613 may be disposed on the side surface 618 of the metal casing 610. Furthermore, the second portions 613 may have the same configuration and may be disposed symmetric to each other, which makes it possible to prevent discharge from being induced only by one of the plurality of curved portion 613.

Accordingly, the second portion 613 of the metal casing 610 may allow static electricity introduced into the metal casing 610 to be transmitted to the PCB 240 through the second portion 613 to directly induce discharge, thereby protecting the camera lens module 20.

FIG. 14 is a front view illustrating the shape of a metal casing of the camera lens driving unit, according to an embodiment of the present disclosure.

The electronic device 10 includes a PCB 240 having one or more terminals 270 formed thereon, an image sensor 250 electrically connected with the terminals 270, the metal casing 710 enclosing one surface of the image sensor 250, and flexible circuit boards 329 and 339 disposed on the inner surface of the metal casing 710.

The PCB 240 may be disposed on the lower portion of the metal casing 710 and may be provided with the one or more terminals 270 arranged with a predetermined interval therebetween. The one or more terminals 270 may be overlaid with solder, and terminal pads 280 may be disposed below the respective terminals 270 to support the same.

Since the arrangement and shapes of the image sensor 250 and the flexible circuit boards 329 and 339 are the same as those in the above-described embodiments, a description thereof will be omitted. Hereinafter, the structure of the metal casing 710 will be described in detail.

The metal casing 710 may have a housing shape and may be disposed on the PCB 240 to protect the camera lens driving unit 700 mounted on the PCB 240 from an external electric shock. The metal casing 710 may be formed of metal and may be, for example, a shield can.

The metal casing 710 may include a first portion 711 and a second portion 713 that have different shapes.

The first portion 711 may correspond to one surface of the metal casing 710 and may be formed to be spaced apart from the PCB 240 by a first distance 712. Further, the second portion 713 of the metal casing 710 may be disposed between the front end portion 710a of the metal casing 710 and the PCB 240 and may be formed to be spaced apart from the PCB 240 by a second distance 714. The first distance 712 and the second distance 714 may differ from each other.

The lateral portion of the metal casing 710 may include a first lateral portion 710a and a second lateral portion 710b that are spaced apart from each other. The first lateral portion 710a may extend from the metal casing 710 and may be disposed on the upper portion thereof, and the second lateral portion 710b may be disposed below the first lateral portion 710a so as to be spaced apart from the first lateral portion by a predetermined distance.

The second portion 713 of the metal casing 710 may be provided on a part of the second lateral portion spaced apart from the first lateral portion 710a of the metal casing 710 by the predetermined distance, and may be formed of the same material as that of the first lateral portion 710a. Further, the second portion 713 may have a planar shape, and one end portion of the second portion 713 may be formed above at least one terminal 270 to form the second distance 714 corresponding to the distance between the terminal 270 and the protruding second portion 713.

The second distance 714 between the second portion 713 and the terminals 270 may be shorter than the first distance 712 between the first portion 711 and the terminals 270. Accordingly, an electrical guide structure that facilitates electrical discharge of the terminals 270 may be achieved by virtue of the second distance 714 formed by the second portion 713 rather than the first distance 712 formed by the first portion 711.

The second portion 713 of the metal casing 710 may be formed above the plurality of terminals 270 and may be disposed to be spaced apart from the terminals 270 by the same second distance 714. The lower surface of the second portion 713 may be formed parallel to a virtual straight line on the upper end of each terminal 270, which makes it possible to prevent discharge from being induced only by one of the plurality of second portions 713.

Accordingly, the second portion 713 of the metal casing 710 may allow static electricity introduced into the metal casing 710 to be transmitted to the PCB 240 through the second portion 713 to directly induce discharge, thereby protecting the camera lens module 20.

Figure 15:
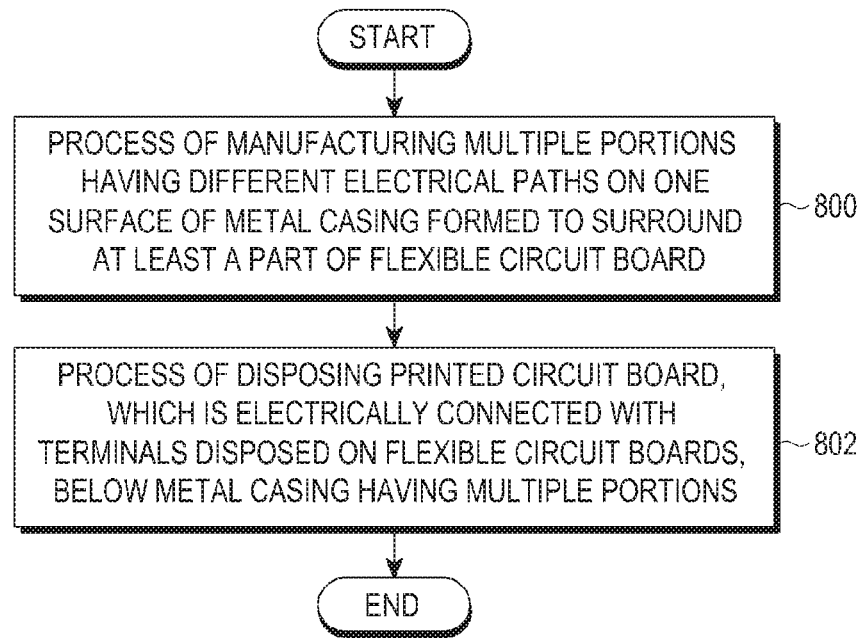
FIG. 15 is a flowchart of a method for manufacturing the camera lens module provided in the electronic device, according to an embodiment of the present disclosure.

FIG. 15 is a flowchart of a method for manufacturing the camera lens module provided in the electronic device, according to an embodiment of the present disclosure.

The method for manufacturing the electronic device 10 may include a process of manufacturing the plurality of portions 311 and 313 having different electrical paths on one surface of the metal casing 310 formed to surround at least a part of the flexible circuit board 339, at step 800.

The process of manufacturing the metal casing 310 may include forming the first portion 311 on one surface of the metal casing 310 and spaced apart from the PCB 240 by the first distance 312 and forming the second portion 313 on one surface of the metal casing 310 and spaced apart from the PCB 240 by the second distance 314.

The first portion 311 may correspond to one surface of the metal casing 310 and may be manufactured to be spaced apart from the PCB 240 by the first distance 312. Further, the second portion 313 may correspond to one surface of the metal casing 310 and may be formed to be spaced apart from the PCB 240 by the second distance 314. The first distance 312 and the second distance 314 may differ from each other.

The second distance 314 between the second portion 313 and the terminals 270 may be shorter than the first distance 312 between the first portion 311 and the terminals 270. Accordingly, an electrical guide structure that facilitates electrical discharge of the terminals 270 may be achieved by virtue of the second distance 314 formed by the second portion 313 rather than the first distance 312 formed by the first portion 311.

In forming the first portion 311, the first portion 311 of the metal casing 310 may be substantially manufactured to be in line on a plane. For example, the first portion 311 may include one surface formed parallel relative to the flat upper surface 316 of the metal casing 310 to maintain a predetermined distance (the first distance 312) from the one or more terminals 270.

In forming the second portion 313, the second portion 313 may be diversely manufactured so as to be disposed closer to the flexible PCB 240, the PCB 240, or the ground of the terminals than other electrical paths.

In forming the second portion 313, the second portion 313 of the metal casing 310 may be manufactured to have the curved portion 319 that protrudes from the metal casing 310. For example, the second portion 313 may be manufactured such that a predetermined area protrudes downward from the metal casing 310. The protruding second portion 313 may be formed above at least one terminal 270 and may form the second distance 314 that corresponds to the distance between the terminal 270 and the protruding second portion 313, as shown in FIG. 7.

Furthermore, the curved portion 319 of the second portion 313 may include the first curved portion 319a and the second curved portion 319b. The first curved portion 319a and the second curved portion 319b may have the same shape and may be disposed symmetric to each other with respect to the metal casing 310, which makes it possible to prevent discharge from being induced only by one curved portion 319.

In forming the second portion 413, the second portion 413 of the metal casing 410 may be formed to have the curved portion 419 that protrudes from the outside of the metal casing 410 by a predetermined distance. For example, the second portion 413 may be formed such that a predetermined area protrudes downward from the metal casing 410. The curved portion 419 of the second portion 413 may be formed above the ground pad 417 and may form the second distance 414 that corresponds to the distance between the ground pad 417 and the protruding second portion 413, as shown in FIG. 9.

Furthermore, the curved portion 419 of the second portion 413 may include the first curved portion 419a and the second curved portion 419b. The first curved portion 419a and the second curved portion 419b may have the same shape and may be disposed symmetric to each other with respect to the metal casing 410, which makes it possible to prevent discharge from being induced only by one curved portion 419.

In forming the second portion 513, the second portion 513 of the metal casing 510 may be formed to have the curved portion 519 that protrudes from the outside of the metal casing 510 by a predetermined distance. For example, the second portion 513 may be formed such that a predetermined area protrudes downward from the metal casing 510. The curved portion 519 of second portion 513 may be formed above the metal member 230 and may form the second distance 514 that corresponds to the distance between the metal member 230 and the protruding second portion 513, as shown in FIG. 11.

Furthermore, the curved portion 519 of the second portion 513 may include the first curved portion 519a and the second curved portion 519b. The first curved portion 519a and the second curved portion 519b may have the same shape and may be disposed symmetric to each other with respect to the metal casing 510, which makes it possible to prevent discharge from being induced only by one curved portion 519.

In forming the second portion 613, the second portion 613 of the metal casing 610 may have a closed-curve shape passing through the metal casing 610 and may be disposed on the side surface 618 of the metal casing 610. Furthermore, a part of the closed-curve shape may be curved inwardly or outwardly to form the curved portion 619. For example, the second portion 613 may have a circular shape and may be disposed in the middle of the side surface 619 of the metal casing 610, and a part of the upper or lower side of the circular shape may be curved inwardly toward the center of the circular shape so as to be spaced the second distance 614 apart from the ground pad 617 disposed in the center of the circular shape, as shown in FIG. 13.

In forming the second portion 713, the second portion 713 of the metal casing 710 may be disposed between the front end portion 710a of the metal casing 710 and the PCB 240 and may be formed to be spaced apart from the PCB 240 by the second distance 714.

The second portion 713 of the metal casing 710 may be a rear end portion spaced apart from the front end portion 710a of the metal casing 710 by a predetermined distance and may be formed of the same material as that of the front end portion 710a. Further, the second portion 713 may have a planar shape, and one surface of the second portion 713 may be formed above at least one terminal 270 to form the second distance 714 corresponding to the distance between the terminal 270 and the protruding second portion 713, as shown in FIG. 14.

Thereafter, a process of disposing the PCB 240, which is electrically connected with the terminals 270 disposed on the flexible circuit boards 329 and 339, below the metal casing 310 having the plurality of portions may be performed, at step 802. The process is identically applied to the various embodiments.

The PCB 240 may be disposed on the lower portion of the metal casing 310 and may be provided with the one or more terminals 270 arranged with a predetermined interval therebetween. The one or more terminals 270 may be overlaid with solder, and the terminal pads 280 may be disposed below the respective terminals 270 to support the same.

The terminals 270 may be formed on the flexible circuit boards 329 and 339 and may be connected with the PCB 240 through the terminal pads 280 to provide paths through which electricity passes. For example, the terminals 270 may be manufactured such that the side surfaces of the terminals 270 may face the flexible circuit boards 329 and 339 and the lower surfaces of the terminals 270 may face the PCB 240.

The PCB 240 may have an opening formed therein, and the image sensor 250 may be received and positioned in the opening of the PCB 240. The image sensor 250 disposed within the PCB 240 is illustrated in FIG. 6. The image sensor 250 may detect information of a subject photographed through the camera lens unit 210 and may convert the information into an electrical image signal. The image sensor 250 may be electrically connected with the one or more terminals 270 to transmit the image signal.

Through the process, the camera lens module 20 in which static electricity introduced into the metal casing 310 is transmitted to the PCB 240 through the second portion 313 to directly induce discharge may be manufactured. Accordingly, by virtue of the camera lens module structure having improved discharge performance, it is possible to protect the camera lens module from an external electric shock using a safe and simple structure.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
   a printed circuit board having at least one terminal formed thereon;
   an image sensor disposed on the printed circuit board and electrically connected to the terminal; and
   a metal casing enclosing at least one surface of the image sensor,
   wherein the metal casing comprises a first portion spaced apart from the printed circuit board by a first distance and a second portion spaced apart from the printed circuit board by a second distance, and
   wherein static electricity introduced into the metal casing is transmitted to the printed circuit board through the second portion and a space corresponding to the second distance.

2. The electronic device of claim 1, wherein the first portion extends parallel relative to the printed circuit board, and the second portion protrudes from an end portion of the metal casing.

3. The electronic device of claim 1, further comprising:
   at least one metal member formed on the printed circuit board and grounded to ground,
   wherein the second portion is electrically connected to the at least one metal member.

4. The electronic device of claim 1, wherein the second portion comprises a first curved portion and a second curved portion.

5. The electronic device of claim 1, further comprising:
   a flexible printed circuit board formed between the printed circuit board and the metal casing.

6. The electronic device of claim 5, wherein the second portion is formed in the metal casing, and is disposed to face at least a portion of the flexible printed circuit board.

7. The electronic device of claim 1, wherein a lateral portion of the metal casing comprises a first lateral portion and a second lateral portion that are spaced apart from each other, wherein the second lateral portion forms the second portion having the second distance which is defined as the distance from an end portion of the second lateral portion to the printed circuit board.

8. The electronic device of claim 1, wherein the printed circuit board comprises at least one ground pattern, and a second distance from the ground pattern is shorter than the first distance.

9. The electronic device of claim 1, wherein the second portion that forms the second distance and the first portion that forms the first distance are provided such that electric flux density according to the second distance is higher than electric flux density according to the first distance, wherein the electric flux density is given by:

$$D = \varepsilon \frac{V}{d},$$

where D denotes electric flux density, V denotes voltage, d denotes distance, and e denotes permittivity.

10. The electronic device of claim 1, wherein the second portion further protrudes one of inward and outward from the metal casing beyond the first portion and provides a path along which the static electricity introduced into the metal casing moves.

11. The electronic device of claim 1, further comprising:
    a ground pad that is disposed one of below the terminal and on one surface of the printed circuit board, and provides a path along which static electricity introduced into the metal casing is discharged to the ground pad.

12. An electronic device comprising:
    a printed circuit board having at least one terminal formed thereon;
    an image sensor disposed on the printed circuit board and electrically connected to the at least one terminal; and
    a metal casing enclosing at least one surface of the image sensor,
    wherein a first portion is formed on a surface of the metal casing and is spaced apart from the printed circuit board by a first distance, and a second portion is disposed between the metal casing and the printed circuit board and is spaced apart from the printed circuit board by a second distance, and
    wherein static electricity introduced into the metal casing is transmitted to the printed circuit board through the second portion and a space corresponding to the second distance.

13. The electronic device of claim 12, wherein the second portion is formed of the same material as the metal casing.

14. A method for manufacturing an electronic device comprising a printed circuit board, an image sensor and a metal casing, the method comprising:
    manufacturing a plurality of portions having different electrical paths on a surface of the metal casing formed to surround at least a part of a flexible circuit board; and
    disposing the printed circuit board below the metal casing having the plurality of portions, the printed circuit board being electrically connected with a terminal disposed on the flexible circuit board, wherein a first portion of the plurality of portions on a surface of the metal casing on a lower portion of the metal casing faces the printed circuit board, and a second portion of the plurality of portions on one of another surface of the metal casing protrudes towards the printed circuit board, and wherein static electricity introduced into the metal casing is transmitted to the printed circuit board through the second portion and a space corresponding to the second distance.

15. The method of claim 14, wherein the first portion is spaced apart from the printed circuit board by a first distance, and the second portion is formed in a position separated from the metal casing, such that the second portion is spaced apart from the printed circuit board by a second distance.

16. The method of claim 15, further comprising forming the second portion such that the second portion provides an electrical path such that static electricity introduced into the metal casing is transmitted to the printed circuit board through the second portion.

17. The method of claim 15, further comprising forming the second portion such that the second portion is disposed closer to one of the flexible printed circuit board, the printed circuit board, and ground of the terminal as opposed to other electrical paths provided inside the electrical device, and wherein the second portion is formed to comprise a first curved portion and a second curved portion.

* * * * *